US012393119B2

(12) United States Patent
Schaffer et al.

(10) Patent No.: US 12,393,119 B2
(45) Date of Patent: Aug. 19, 2025

(54) OPTICAL SYSTEM AND LITHOGRAPHY APPARATUS

(71) Applicant: Carl Zeiss SMT GmbH, Oberkochen (DE)

(72) Inventors: Dirk Schaffer, Jena (DE); Wolfgang Scherm, Nattheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 191 days.

(21) Appl. No.: 18/183,774

(22) Filed: Mar. 14, 2023

(65) Prior Publication Data
US 2023/0221646 A1 Jul. 13, 2023

Related U.S. Application Data

(63) Continuation of application No. PCT/EP2021/072693, filed on Aug. 16, 2021.

(30) Foreign Application Priority Data

Sep. 17, 2020 (DE) .................. 102020211691.1

(51) Int. Cl.
*G03F 7/20* (2006.01)
*G01B 9/02* (2022.01)
(Continued)

(52) U.S. Cl.
CPC .......... *G03F 7/20* (2013.01); *G01B 9/02049* (2013.01); *G02B 7/003* (2013.01); *G02B 27/62* (2013.01)

(58) Field of Classification Search
CPC ...... G03F 7/20; G03F 7/70258; G03F 7/7085; G03F 7/70825; G01B 9/02049; G02B 7/003; G02B 27/62; G02B 7/00
See application file for complete search history.

(56) References Cited

U.S. PATENT DOCUMENTS

2006/0192328 A1   8/2006 Morrison et al.
2008/0037029 A1*  2/2008 Nawata ............... G03F 7/70825
                                                    356/615

FOREIGN PATENT DOCUMENTS

DE   10 2013 204 419 A1   4/2014
DE   10 2017 219 754 A1   1/2018
(Continued)

OTHER PUBLICATIONS

Translation of international Search Report for corresponding PCT Appl No. PCT/EP2021/072693, dated Dec. 7, 2021.

*Primary Examiner* — Mesfin T Asfaw
(74) *Attorney, Agent, or Firm* — Fish & Richardson P.C.

(57) ABSTRACT

An optical system for lithography apparatus comprises a movable element and a functional element having a first and second portions. The optical element is designed as an optical element or as a reference structure. The first portion is fastened to the movable element by a joining mechanism along a fastening plane. The second portion comprises a functional surface. The functional element comprises a decoupling device for decoupling by deformation the first portion from the second portion. The decoupling device is formed by a narrowing of the functional element. The narrowing is located laterally outside a region of the functional surface. The functional surface is a measurement surface which is suitable for acquisition for the purposes of positioning and/or orientating the movable element.

20 Claims, 6 Drawing Sheets

(51) Int. Cl.
  *G02B 7/00* (2021.01)
  *G02B 27/62* (2006.01)

(56) References Cited

FOREIGN PATENT DOCUMENTS

DE    10 2019 215 217 A1    11/2019
DE    10 2019 215 226 A1    11/2019
JP          2018-101112 A     6/2018
WO    WO 2011/029467 A1     3/2011

* cited by examiner

OPTICAL SYSTEM AND LITHOGRAPHY APPARATUS

CROSS-REFERENCE TO RELATED APPLICATIONS

The present application is a continuation of, and claims benefit under 35 USC 120 to, international application PCT/EP2021/072693, filed Aug. 16, 2021, which claims benefit under 35 USC 119 of German Application No. 10 2020 211 691.1, filed Sep. 17, 2020. The entire disclosure of these applications are incorporated by reference herein.

FIELD

The present disclosure relates to an optical system, to a lithography apparatus having such an optical system, and to a method for positioning and/or orienting a movable element in such an optical system.

BACKGROUND

Microlithography is used for producing microstructured component parts, such as for example integrated circuits. The microlithography process is typically performed using a lithography apparatus, which has an illumination system and a projection system. The image of a mask (reticle) illuminated via of the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, are used instead of—as previously—refractive optical units, that is to say lens elements.

The mirrors may for example be fastened to a supporting frame (force frame) and be designed as at least partially manipulable, in order to allow a movement of a respective mirror in up to six degrees of freedom, and consequently a highly accurate positioning of the mirrors in relation to one another, in particular in the pm range. This can allow changes in the optical properties that occur for instance during the operation of the lithography apparatus, for example as a result of thermal influences, to be compensated for.

Functional surfaces can be provided on the mirror for positioning and/or orienting the mirror. The functional surfaces can serve as reference points, the positions of which are detected using sensors, for example, in order to deduce the position of the mirror therefrom. To be able to determine the exact position of the mirror, it is often desirable that a relative position of the functional surface relative to the mirror always remains the same. In this context, it can be desirable for the functional surface does not deform.

If a functional element carrying the functional surface is connected to the optical element by a joining process, joining stresses (e.g., adhesive stresses) may lead to undesired deformations of the functional surface. Such deformations can occur especially when the joint ages.

In order to reduce such deformations, US 2006/0192328 A1 proposes the connection of the functional element to the optical element via legs in order to reduce a contact surface. Further, grooves or the like are provided in the optical element and/or in the functional element in the connection region, and this further reduces deformations.

In some cases, however, this deformation decoupling is not sufficient.

WO 2011/029467 A1 discloses a mirror body for a mirror. A cutout is provided in the mirror body to reduce stress in the mirror body.

SUMMARY

The present disclosure seeks to provide an improved optical system and an improved lithography apparatus.

According to a first aspect, an optical system for a lithography apparatus is proposed. The optical system comprises:
  a movable element which is in the form of an optical element or a reference structure; and
  a functional element having a first and a second portion, with the first portion being fastened along a fastening plane to the movable element using a joining agent and the second portion comprising a functional surface; wherein
  the functional element comprises a decoupling device for deformation decoupling of the first portion from the second portion, the decoupling device being formed by a constriction of the functional element.

The decoupling device can serve to decouple deformations in the first portion from deformations in the second portion. Stresses in the joining agent (for example adhesive stresses), which occur as the joining agent ages, only lead to a deformation of the first portion, while the second portion is not deformed (or at least deformed significantly less than without the decoupling device). This can help prevent a deformation of the functional surface of the second portion. The functional surface can still to be used as a reference surface for accurate positioning and/or orienting of the movable element, even in the event of the joining agent aging or being subject to environmental changes (for example changes in humidity).

The decoupling device can be provided between the first and the second portion. In embodiments, the decoupling device is not adjacent to the fastening plane, but is provided at a distance therefrom.

A constriction is understood to mean, in particular, a local cross-sectional reduction of the functional element. This cross-sectional reduction can be formed by a cutout on at least one side of the functional element. However, it can also be in circumferential form. The constriction is obtained by milling, for example.

The decoupling device can be arranged in a force path between the fastening plane and the functional surface. The term "force path" refers in particular to the path or route along which the flow of forces of the joining stresses would extend if no decoupling device were provided. The force path can extend in a straight line between the fastening plane and the functional surface. For example, the decoupling device or the constriction can intersect all, or a part of all, possible force paths in a straight line between the fastening plane and the functional surface.

The constriction is arranged, for example, laterally outside a region of the functional surface. This means in particular that the constriction is arranged to the side of the functional surface (laterally to said surface). Consequently, the constriction can be arranged next to the functional surface. For example, the functional surface is a part of the functional element that has been processed (for example polished) to form the functional surface, or a portion that has been coated to form the functional surface.

The constriction can have a cutout that is set back perpendicularly to the functional surface. By way of example, the constriction is not provided below the functional surface. The "region of the functional surface" is understood to mean, in particular, at least the functional surface itself, but the region of the functional surface also comprises, in particular, the part of the second portion which is arranged below the functional surface and/or carries the functional surface. An overall height of the functional element and hence of the optical system can be reduced by the lateral arrangement of the constriction outside of the region of the functional surface.

The movable element can be an optical element, for example a mirror or a lens element, or a reference structure (sensor frame) used for positioning sensors and/or optical elements. The position and/or orientation of the movable element can be determined and changed by detecting the position and/or orientation of the functional surface.

An adhesive connection or a soldered connection can come into question as a joining process for connecting the movable element to the functional element. Both adhesive connections and soldered connections can change with age. Frictional connections (e.g., screws) are also conceivable, but the materials of the functional element and movable element is adapted accordingly.

In particular, the fastening plane is a plane that extends along a joint between the first portion and the movable element. The fastening plane can be a flat surface or assume any shape of the joint. The highest possible stiffness should be provided in the region of the fastening plane.

The deformation decoupling of the first portion from the second portion can help prevent deformations of the second portion on the order of picometers in particular. This can enable positioning with an accuracy on the order of picometers.

The functional element can be made of glass ceramic, for example, and is processed (reflectively) to form the functional surface. In this case, the functional surface can be a part of the functional element that is processed and polished to form a mirror. Alternatively or additionally, the functional surface can be formed by a coating of the functional element. Alternative materials for the functional element are materials that have a coefficient of thermal expansion of zero or the smallest possible coefficient of thermal expansion.

The functional surface is optionally a measurement surface suitable for being detected for the purpose of positioning and/or orienting the movable element. For example, the functional surface is not an optical element used for beam guidance in beam shaping, illumination or projection in the lithography apparatus. Rather, the functional surface can be a measurement surface suitable for being scanned for the purpose of positioning and/or orienting the movable element. The functional surface can serve as a reference surface (measurement surface), the position and/or orientation of which is evaluated using sensors or using an interferometer, for example. The position and/or orientation of the movable element can be determined from the position properties obtained. For example, the functional surface is used to position and/or orient the movable element. The functional surface can be a flat surface.

According to an embodiment, the constriction of the functional element is a cross-sectional reduction of the functional element vis-à-vis a first cross section of the first portion and vis-à-vis a second cross section of the second portion.

In the present case, the term "cross section" means in particular the area of a cut surface of the functional element. In particular, the cross section of the functional element is smallest in the region of the constriction. The constriction forms, so to speak, a jump in stiffness in the functional element.

According to a further embodiment, the cross-sectional reduction is at least 10%, such as at least 30%, for example at least 50%, of the first and/or the second cross section.

The cross-sectional reduction can be at least 20%, at least 40% or at least 60% of the first and/or the second cross section. The cross-sectional reduction should be at least 10% in order to obtain deformation decoupling of the first portion from the second portion. The greater the cross-sectional reduction, the greater the deformation decoupling obtained.

The cross-sectional reduction can be at least 10%, such as at least 30%, for example at least 50%, of the smaller adjacent cross section from the first and the second cross section.

According to a further embodiment, the cross-sectional reduction is at most 70% of the first and/or the second cross section.

In the case of a cross-sectional reduction of more than 70%, such as of more than 80%, there is a risk of the free-standing second portion vibrating. Cross-sectional reductions below 70% or 80% can be stable enough and offer sufficient residual stiffness. The maximum cross-sectional reduction often depends on the weight of the second portion and the functional surface for example.

In some cases, the cross-sectional reduction is no more than 70% (or 80%) of the smaller adjacent cross section from the first and the second cross section.

According to a further embodiment, the constriction comprises at least one cutout which is set back perpendicularly to the functional surface.

The cutout can be formed in the form of a groove. The cutout set back perpendicularly to the functional surface can lead to a reduction in the cross section of the functional element perpendicular to the functional surface. For example, the cutout is provided on the same side of the functional element as the functional surface.

According to a further embodiment, the constriction has two cutouts arranged in aligning fashion on opposite sides of the functional element According to a second embodiment, a further optical system for a lithography apparatus is proposed. The optical system comprises:
  a movable element which is in the form of an optical element or a reference structure; and
  a functional element having a first and a second portion, with the first portion being fastened along a fastening plane to the movable element using a joining agent and the second portion comprising a functional surface; wherein
  the first portion is made of a first material and the second portion is made of a different second material.

The first portion is made of a first material and the second portion can be made of a different second material, at least outside of the functional surface. In some cases, the functional element is made of two different materials outside of the functional surface. This means that the functional element is made of at least two different materials, even if the material of the functional surface is not counted.

In the case of a functional surface that is obtained by processing and polishing the functional element, the functional element is made of exactly two materials, for example: the first portion is made of the first material and the second portion, including the functional surface, is made of the second material. If the functional surface is formed by a coating of the functional element, the functional element comprises, for example, the first portion made of the first material, the second portion made of the second material, and the coating that forms the functional surface and is made of at least one coating material.

The use of two different materials for the functional element can serve to decouple deformations in the first portion from deformations in the second portion. Stresses in the joining agent (for example adhesive stresses), which occur in particular as the joining agent ages, only lead to a deformation of the first portion, while the second portion is not deformed (or at least deformed significantly less than when the same materials are used). This can help prevent a deformation of the functional surface of the second portion. The functional surface can still to be used as a reference surface for accurate positioning and/or orienting of the movable element, even in the event of the joining agent aging or being subject to environmental changes (for example changes in humidity).

The first material is invar (FeNi36), for example, while the second material is cordierite, for example.

According to an embodiment, the functional element of the second embodiment comprises a decoupling device for deformation decoupling of the first portion from the second portion, the decoupling device being formed by a constriction of the functional element.

The combination of the decoupling solutions of the first aspect (decoupling device) and the second aspect (use of two materials) with one another is conceivable. In this case, individual embodiments and described properties of the two aspects can be combined with one another as desired. The deformation decoupling of the first portion from the second portion is improved by combining the two decoupling solutions.

According to a further embodiment, the first portion and the second portion are connected to one another by a solder connection.

In general, other connections between the first and the second portion are also possible. However, it is important that the connection between the two portions causes significantly less deformations than the connection between the movable element and the functional element.

According to a further embodiment, the first and second portions are integrally formed.

Integrally formed means that the first and second portions are primary formed, in particular cast, in one part.

The integral embodiment not only simplifies production, but also can help prevent the need for a joint between the first and second portion, which could lead to further deformations.

According to a further embodiment, the first material has a lower stiffness than the second material.

Since invar is significantly softer than cordierite, it is suitable to use invar as the first material and cordierite as the second material. Both materials used can have a coefficient of linear expansion $\alpha$, which at 20° C., is less than $10*10^{-6}$ $K^{-1}$, such as less than $6*10^{-6}$ $K^{-1}$.

According to a further embodiment, the first portion is fastened to the movable element by adhesive bonding.

According to a further embodiment, the functional surface is suitable for being detected, in particular scanned interferometrically, for the purpose of positioning and/or orienting the movable element.

The functional surface serves as a reference surface, the position and/or orientation of which is evaluated using sensors or using an interferometer, for example. The position and/or orientation of the movable element can be determined from the position properties obtained. In particular, the functional surface can be used to position and/or orient the movable element.

The functional surface can be in the form of a mirror surface. The functional surface can be a flat surface.

In accordance with a third aspect, a lithography apparatus comprising an optical system in accordance with the first or second aspect or in accordance with an embodiment of the first or second aspect is proposed.

In accordance with a fourth aspect, a method for positioning and/or orienting a movable element using an optical system in accordance with the first or second aspect or in accordance with an embodiment of the first or second aspect is proposed. The method comprises:
 a) detecting position properties of the functional surface, in particular by interferometric scanning; and
 b) positioning and/or orienting the movable element on the basis of the detected position properties.

"A" or "an" in the present case should not necessarily be understood to be restrictive to exactly one element. Rather, a plurality of elements, such as for example two, three or more, may also be provided. Any other numeral used here should also not be understood to the effect that there is a restriction to exactly the stated number of elements. Rather, unless indicated otherwise, numerical deviations upwards and downwards are possible.

The embodiments and features described for the optical systems are correspondingly applicable to the proposed lithography apparatus and to the proposed method, and vice versa.

Further possible implementations of the disclosure also comprise not explicitly mentioned combinations of features or embodiments that are described above or below with respect to the exemplary embodiments. In this case, a person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described hereinafter.

BRIEF DESCRIPTION OF THE DRAWINGS

The disclosure is explained in greater detail below on the basis of embodiments with reference to the appended figures.

DETAILED DESCRIPTION

Unless indicated otherwise, elements that are identical or functionally identical have been given the same reference signs in the figures. It should also be noted that the illustrations in the figures are not necessarily true to scale.

Figure 1A:
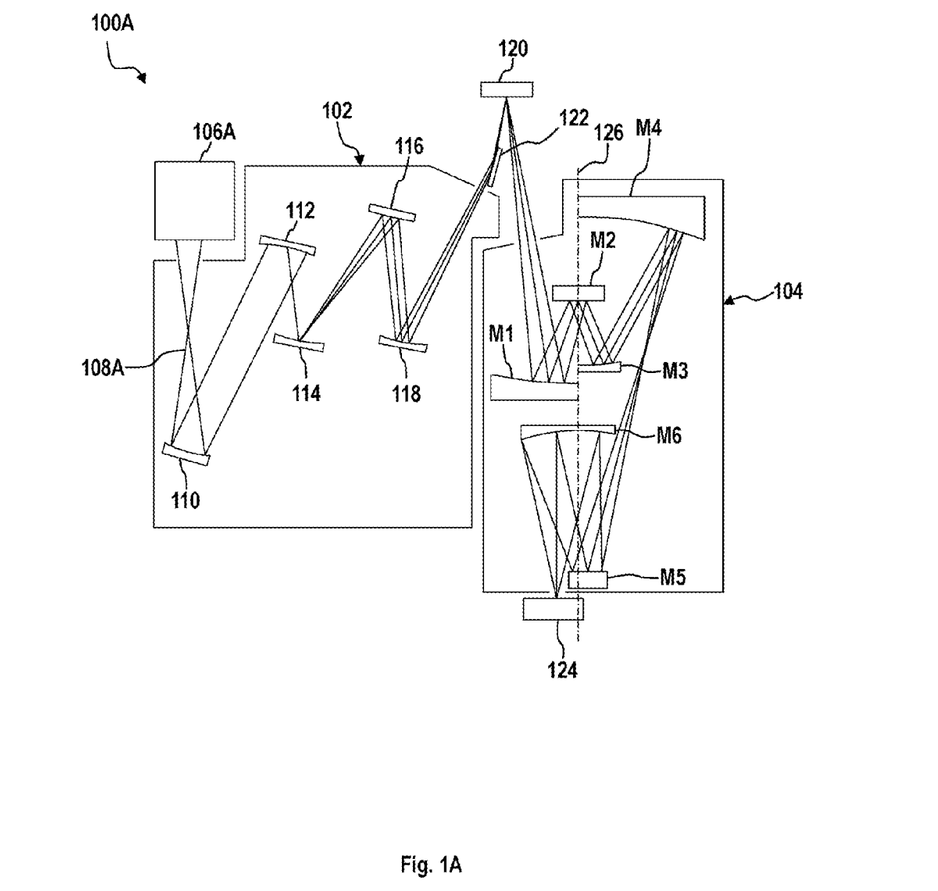
FIG. 1A shows a schematic view of an embodiment of an EUV lithography apparatus.

FIG. 1A shows a schematic view of an EUV lithography apparatus 100A comprising a beam shaping and illumination system 102 and a projection system 104. In this case, EUV stands for "extreme ultraviolet" and denotes a wavelength of the work light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which driving apparatuses for mechanically moving or setting optical elements are provided.

Furthermore, electrical controllers and the like may also be provided in said machine room.

The EUV lithography apparatus 100A has an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (reticle) 120. The photomask 120 is likewise embodied as a reflective optical element and can be arranged outside the systems 102, 104. Furthermore, the EUV radiation 108A may be directed at the photomask 120 via a mirror 122. The photomask 120 has a structure which is imaged onto a wafer 124 or the like in a reduced fashion via the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided.

Furthermore, the mirrors M1 to M6 are generally curved on their front sides for beam shaping.

Figure 1B:
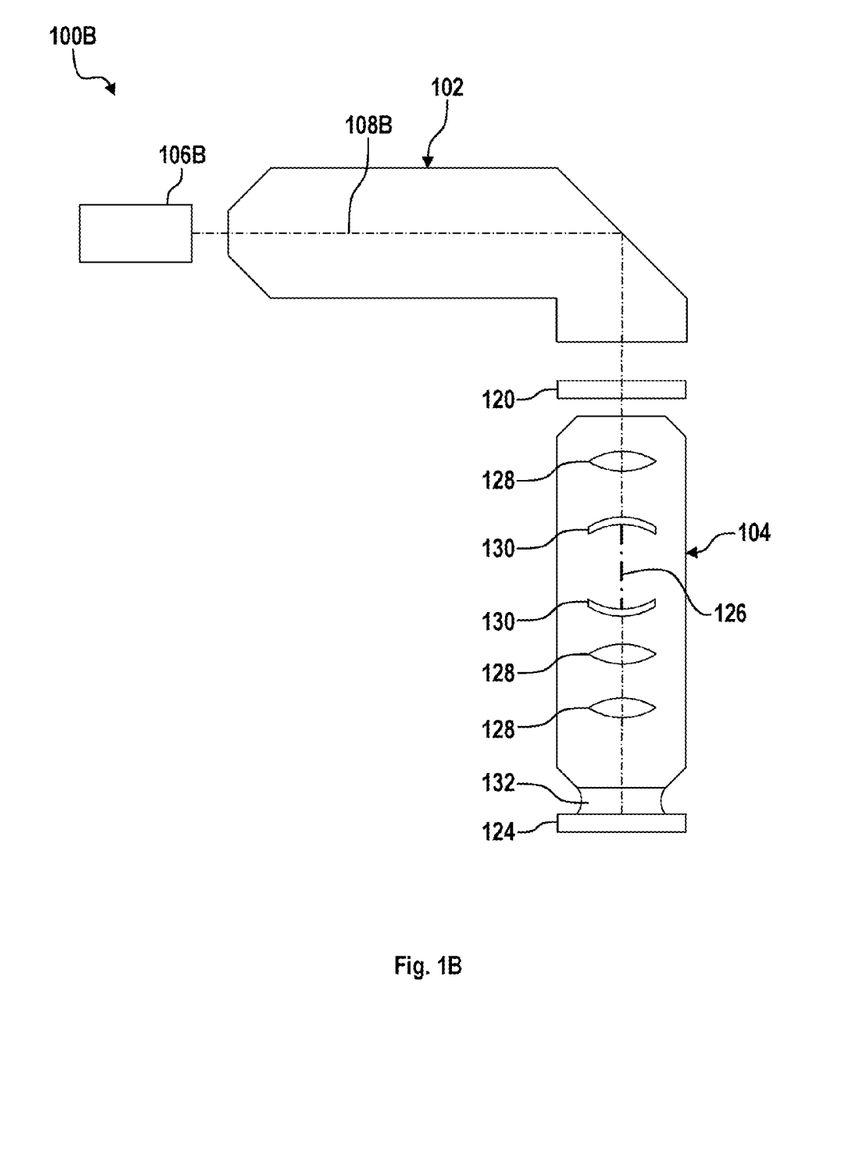
FIG. 1B shows a schematic view of an embodiment of a DUV lithography apparatus.

FIG. 1B shows a schematic view of a DUV lithography apparatus 100B, which comprises a beam shaping and illumination system 102 and a projection system 104. In this case, DUV stands for "deep ultraviolet" and denotes a wavelength of the work light of between 30 nm and 250 nm.

As has already been described with reference to FIG. 1A, the beam shaping and illumination system 102 and the projection system 104 can be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 can also be provided. Furthermore, the mirrors 130 are generally curved on their front side for beam shaping.

An air gap between the last lens element 128 and the wafer 124 can be replaced by a liquid medium 132 having a refractive index>1. The liquid medium 132 may be high-purity water, for example. Such a construction is also referred to as immersion lithography and has an increased photolithographic resolution. The medium 132 can also be referred to as an immersion liquid.

Figure 2:
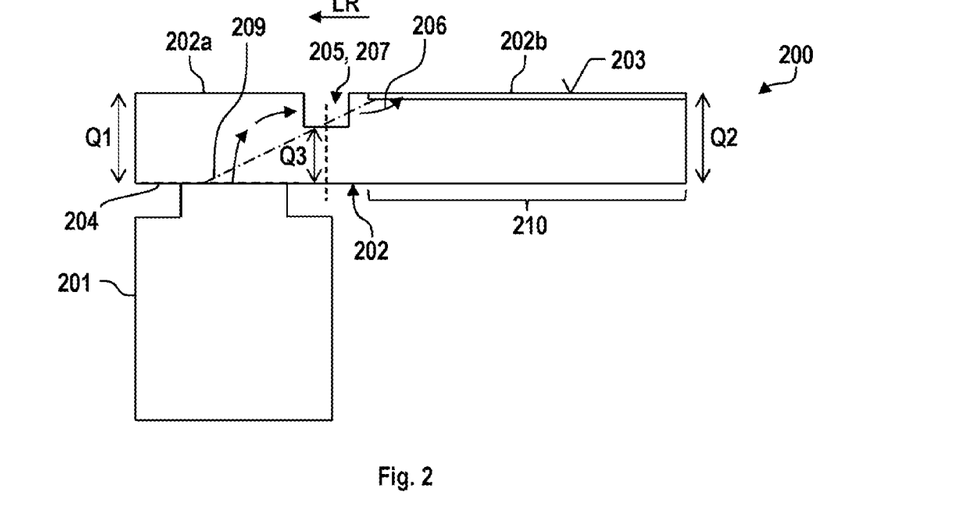
FIG. 2 shows a view of an optical system according to a first embodiment.

FIG. 2 shows a view of an optical system 200 according to a first embodiment. The optical system 200 comprises a movable element 201 and a functional element 202 which, for example, has an elongate cross-section.

In this case, the movable element 201 is an optical element, specifically a mirror 110, 112, 114, 116, 118, 130 or M1-M6 of the lithography apparatus 100A, 100B described above. In further embodiments, the optical element 201 can alternatively be a lens element 128 or another movable element of the lithography apparatus 100A, 100B.

The functional element 202 is connected to the optical element 201 along a (for example flat) fastening plane 204. An adhesive is used as a joining agent for this purpose. The region of the functional element 202 that adjoins the fastening plane 204 is referred to as the first portion 202a. The functional element 202 has a second portion 202b at a free end of said functional element 202 remote from the fastening plane 204.

The second portion 202b comprises a functional surface 203, which is in the form of a mirror surface here. The functional surface 203 serves as a reference surface (measurement surface) for positioning and orienting the mirror 201. To this end, the position and orientation of the functional surface 203 are detected interferometrically, and the position and orientation of the mirror 201 is inferred from the information recorded. The position and orientation of the mirror 201 can be adjusted and monitored accordingly.

The virtual boundary between the first portion 202a and the second portion 202b is represented by a dashed line in FIG. 2 and the following figures.

In the course of the aging process of the adhesive, adhesive stresses change and deformations (especially distortions and expansions) occur along the force path 206, which is indicated by small arrows in FIG. 2. In order to prevent the changing adhesive stresses from deforming the functional surface 203—which would adversely affect the accuracy of the positioning and orientation of the optical element 201—the functional element 202 comprises a decoupling device 207.

The decoupling device 207 is in the form of a constriction 205 and interrupts the force path 206. This results in a deformation decoupling of the first portion 202a from the second portion 202b. The deformations which cause the changing adhesive stresses are not transferred (or transferred to a significantly lesser extent) to the second portion 202b and the functional surface 203.

In the embodiment shown in FIG. 2, the constriction 205 is embodied as a cutout in the form of a groove. The constriction 205 is arranged laterally (sideways) outside of a region 210 of the functional surface 203. In this case, the constriction 205 is arranged laterally to the left of the functional surface 203 in the illustration in FIG. 2. The region 210 of the functional surface 203 includes the functional surface 203 and the underlying part of the second portion 206b. The lateral direction LR is shown in FIG. 2 by an arrow pointing to the left. The cutout 205 is set back perpendicularly to the functional surface 203. The constriction 205 is provided only on one side of the functional element 202, specifically on the same side as the functional surface 203. As a result, deformations of the functional surface 203 can be prevented particularly well.

The cutout 205 reduces the cross section of the functional element 202. In the region of the cutout 205, the cross section Q3 of the functional element 202 is only 50% of the cross section Q1 of the adjacent first portion 202a and also only 50% of the cross section Q2 of the adjacent second portion 202b.

The cutout 205 is arranged in such a way that it intersects a line 209 which extends between a point on the optical element 201 along the fastening plane 204 and a point on the functional surface 203.

Figure 3:
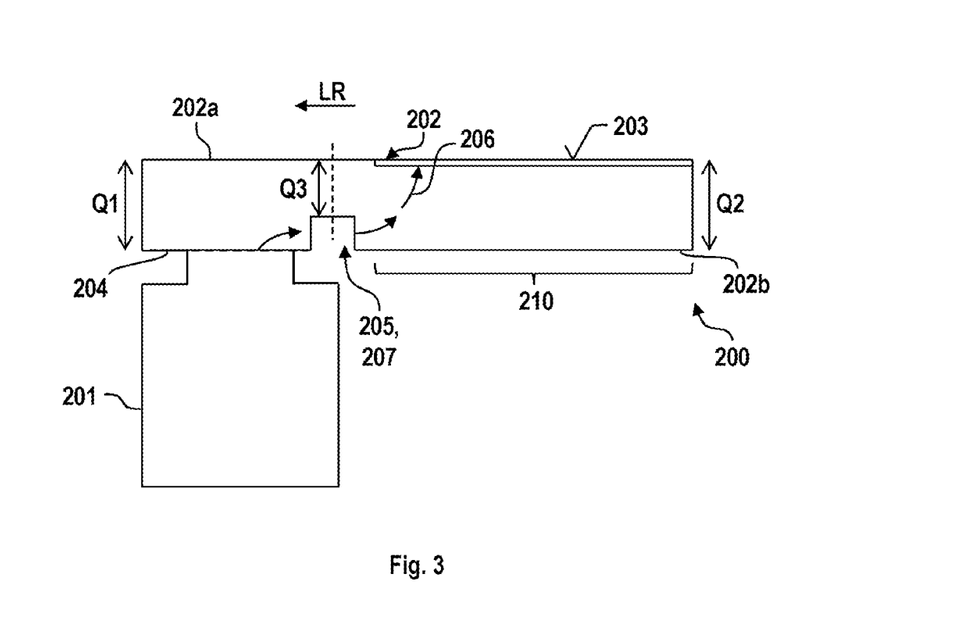
FIG. 3 shows a view of an optical system according to a second embodiment.

FIG. 3 shows a view of an optical system 200 according to a second embodiment. The optical system 200 of FIG. 3 largely corresponds to the optical system 200 of FIG. 2, with only the position of the cutout 205 being changed. In FIG. 3, the cutout 205 is provided on the side opposite to the functional surface 203. In FIG. 3, the cutout 205 is also arranged laterally (sideways) outside of a region 210 of the functional surface 203. In the example of FIG. 3, the cutout 205 is provided on the same side as the optical element 201. The dimensions of the cross sections Q1, Q2 and Q3 are the same as described with respect to FIG. 2.

Figure 4:
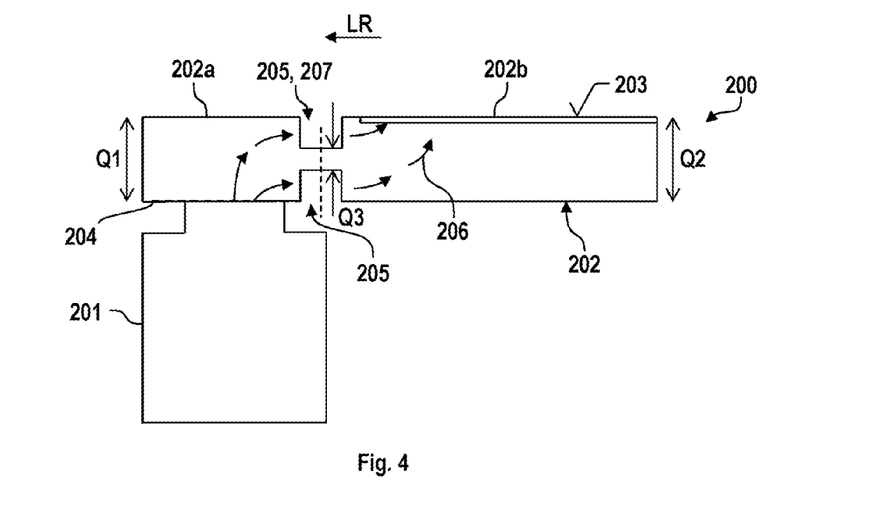
FIG. 4 shows a view of an optical system according to a third embodiment.

FIG. 4 shows a view of an optical system 200 according to a third embodiment. The optical system 200 of FIG. 4 largely corresponds to the optical system 200 of FIG. 2, with the decoupling device 207 however comprising a second cutout 205. In the exemplary embodiment of FIG. 4, a further cutout 205 is provided on the side opposite to the functional surface 203. The two cutouts 205 are arranged in aligning fashion. They are both arranged laterally from the region 210 of the functional surface 203.

The cross section Q3 in the region of the decoupling device 207 is reduced even further by the two cutouts 205. The cross section Q3 in this case is 40% of the cross sections Q1 and Q2, with each cutout 205 contributing to a cross-sectional reduction of 30%.

Figure 5:
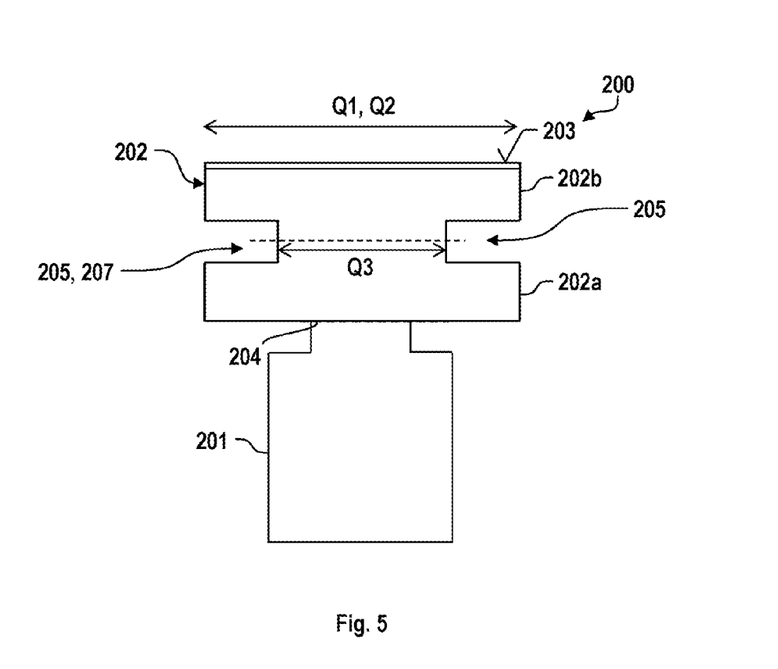
FIG. 5 shows a view of an optical system according to a fourth embodiment.

FIG. 5 shows a view of an optical system 200 according to a fourth embodiment. The optical system 200 of the fourth embodiment comprises a functional element 202 which substantially has an "H-shape". In this case, the functional surface 203 is not provided on a protruding, free end of the functional element 202, but above the optical element 201.

In FIG. 5, the deformation decoupling of the first portion 202a from the second portion 202b is similar to that in FIG. 4: the decoupling device 207 also comprises cutouts 205 on both sides in this case. However, these are set back parallel to the functional surface 203 and to the fastening plane 204. The cross section Q3 in this case is 40% of the cross sections Q1 and Q2, with each cutout 205 contributing to a cross-sectional reduction of 30%.

Figure 6:
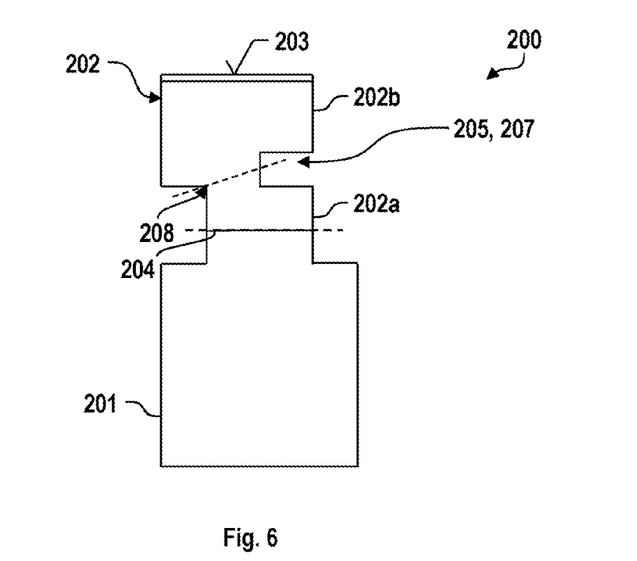
FIG. 6 shows a view of an optical system according to a fifth embodiment.

FIG. 6 shows a view of an optical system 200 according to a fifth embodiment. In FIG. 6 the functional element 202 has an asymmetric form. In this case, the functional surface 203 is not provided on a protruding, free end of the functional element 202, but above the optical element 201. In this case, the decoupling device 207 is formed by virtue of forming a cutout 205 (on the right-hand side in FIG. 6) and an inwardly projecting edge 208, both of which lead to a cross-sectional reduction of the functional element 202.

Figure 7:
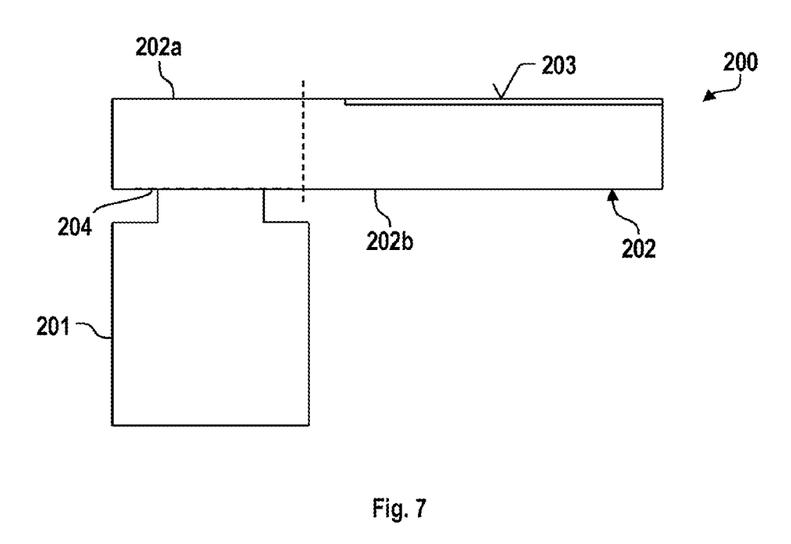
FIG. 7 shows a view of an optical system according to a sixth embodiment.

FIG. 7 shows a view of an optical system 200 according to a sixth embodiment. The functional element 202 substantially has the same shape as in FIGS. 2 to 4. However, no constriction 205 is provided.

The functional element 202 of FIG. 7 is made of two different materials for deformation decoupling of the first portion 202a from the second portion 202b. The first portion 202a is made of a first material while the second portion 202b is made of a second material. In this case, the functional element 202 is integrally formed in order to prevent a joint between the two portions 202a, 202b. The first and second portions 202a, 202b are not fastened to one another using an additional joining process (welding or the like). The two portions 202a, 202b are cast on one piece, for example. Alternatively, the two portions 202a, 202b are produced and interconnected in an application method (additive manufacturing).

The first material is less stiff than the second material. By way of example, the first portion 202a is made of invar and the second portion 202b is made of cordierite.

Figure 8:
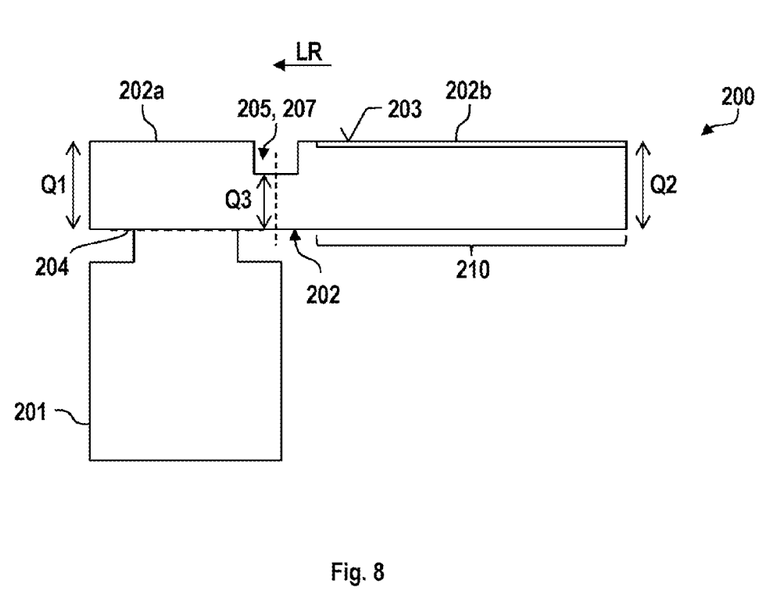
FIG. 8 shows a view of an optical system according to a seventh embodiment.

FIG. 8 shows a view of an optical system 200 according to a seventh embodiment. This is a combination of the first and sixth embodiment: the first and second portions 202a, 202b are made of different materials, and a constriction (cutout) 205 is also provided. This achieves even greater deformation decoupling.

The use of two different materials, as described with reference to FIG. 7, can be combined with any embodiment of FIGS. 2 to 6.

Although the present disclosure has been described with reference to exemplary embodiments, it is modifiable in various ways. The cutout 205 can be formed all around, for example. In all of the described embodiments, the optical element 201 can also be replaced by a reference structure. The cross sections Q1 and Q2 are equal in the described embodiments; however, cross sections Q1 and Q2 that differ from one another are also conceivable. The depth of the cutout 205 can also vary arbitrarily between 10% and 80%. In FIGS. 2 to 8, the described cross-sectional reduction results only from the change (reduction) in height or width of the functional element 202. However, the cross-sectional reduction can also be achieved by a constriction of functional element 202 in multiple dimensions (for example, in height and width).

The line 209 is shown in FIG. 2 only. However, the cutouts 205 of FIGS. 3 to 6 and 8 can also each be arranged in such a way that they intersect a line 209 which extends between a point on the optical element 201 along the fastening plane 204 and a point on the functional surface 203. It is also conceivable that the cutouts 205 of FIGS. 2 to 6 and 8 are arranged in such a way that they intersect every possible straight line 209 which extends between a point on the optical element 201 along the fastening plane 204 and a point on the functional surface 203.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens
130 Mirror
132 Medium
200 Optical system
201 Movable element
202 Functional element
202a First portion
202b Second portion
203 Functional surface
204 Fastening plane
205 Constriction
206 Force path
207 Decoupling device
208 Edge
209 Line
210 Region of the functional surface
LR Lateral direction
M1 Mirror
M2 Mirror
M3 Mirror
M4 Mirror
M5 Mirror
M6 Mirror
Q1 Cross section of the first portion
Q2 Cross section of the second portion
Q3 Cross section of the constriction

What is claimed is:

1. An optical system, comprising:
a movable element comprising a member selected from the group consisting of an optical element and a reference structure;
a functional element comprising a first portion, a second portion, and a constriction configured to deformationally decouple the first portion from the second portion; and
a joining agent fastening the first portion to the movable element along a fastening plane,
wherein:
the first and second portions are one integral piece;
the second portion comprises a functional surface;
the constriction is laterally outside a region of the functional surface;
the functional surface comprises a detectable measurement surface;
a position and/or orientation of the movable element is modifiable based on information from the detectable measurement surface.

2. The optical system of claim 1, wherein the constriction comprises a cross-sectional reduction of the functional element vis-à-vis a first cross section of the first portion and vis-à-vis a second cross section of the second portion.

3. The optical system of claim 2, wherein the cross-sectional reduction is at least 10% of a member selected from the group consisting of the first cross section and the second cross section.

4. The optical system of claim 3, wherein the cross-sectional reduction is at most 70% of the member.

5. The optical system of claim 1, wherein the constriction comprises a cutout perpendicularly set back relative to the functional surface.

6. The optical system of claim 1, wherein the constriction comprises two cutouts aligned on opposite sides of the functional element.

7. The optical system of claim 1, wherein the joining agent comprises an adhesive.

8. The optical system of claim 1 wherein the functional element is interferometrically scannable.

9. An apparatus, comprising:
an optical system according to claim 1,
wherein the apparatus is a lithography apparatus.

10. A method, comprising:
providing an optical system according to claim 1;
detecting position properties of the functional surface; and
positioning and/or orienting the movable element based on the detected position properties.

11. The optical system of claim 1, wherein there is no joint between the first and second portions.

12. An optical system, comprising:
a movable element comprising a member selected from the group consisting of an optical element and a reference structure; and
a functional element comprising a first portion, a second portion, and a joining agent fastening the first portion to the movable element along a fastening plane,
wherein:
the first and second portions are one integral piece;
the second portion comprises a functional surface; and
the first portion comprises a first material;
outside of the functional surface, the second portion comprises a second material different from the first material.

13. The optical system of claim 12, wherein the functional element comprises a constriction configured to deformationally decouple the first portion from the second portion.

14. The optical system of claim 12, wherein the first and second portions are connected to one another by a solder connection.

15. The optical system of claim 12, wherein the first material has a lower stiffness than the second material.

16. The optical system of claim 12, wherein the first portion is adhesively bonded to the movable element.

17. The optical system of claim 12, wherein the functional surface is interferometrically scannable.

18. An apparatus, comprising:
an optical system according to claim 12,
wherein the apparatus is a lithography apparatus.

19. A method, comprising:
providing an optical system according to claim 12;
detecting position properties of the functional surface; and
positioning and/or orienting the movable element based on the detected position properties.

20. The optical system of claim 12, wherein there is no joint between the first and second portions.

* * * * *

UNITED STATES PATENT AND TRADEMARK OFFICE
CERTIFICATE OF CORRECTION

| | | |
|---|---|---|
| PATENT NO. | : 12,393,119 B2 | Page 1 of 1 |
| APPLICATION NO. | : 18/183774 | |
| DATED | : August 19, 2025 | |
| INVENTOR(S) | : Dirk Schaffer and Wolfgang Scherm | |

It is certified that error appears in the above-identified patent and that said Letters Patent is hereby corrected as shown below:

In the Specification

Column 4, Line 48, after "element" insert -- . --.

Signed and Sealed this
Tenth Day of February, 2026

John A. Squires
*Director of the United States Patent and Trademark Office*